United States Patent [19]
Hirano

[11] Patent Number: 5,920,273
[45] Date of Patent: Jul. 6, 1999

[54] DIGITAL-TO-ANALOG CONVERTER

[75] Inventor: Masamitsu Hirano, Hamamatsu, Japan

[73] Assignee: Yamaha Corporation, Hamamatsu, Japan

[21] Appl. No.: 08/903,684

[22] Filed: Jul. 31, 1997

[30] Foreign Application Priority Data

Aug. 1, 1996 [JP] Japan ................................. 8-203941

[51] Int. Cl.$^6$ .................................................. H03M 1/66
[52] U.S. Cl. ......................... 341/144; 341/143; 341/118
[58] Field of Search .................................... 341/144, 143, 341/118, 120, 152

[56] References Cited

U.S. PATENT DOCUMENTS 5,231,395  7/1993  Irwin et al. ............................. 341/143

*Primary Examiner*—Brian Young
*Attorney, Agent, or Firm*—Graham & James LLP

[57] ABSTRACT

A digital-to-analog converting section includes a delta-sigma ($\Delta\Sigma$) modulator and converts an input digital signal to an analog signal on the basis of delta-sigma modulation of the input digital signal by the delta-sigma modulator. A digital adder is provided, at the input stage of the digital-to-analog converting section, to add an oscillation-preventing direct current value to the input digital signal, and the adder operates to prevent oscillation in the delta-sigma modulating loop when the input digital signal changes from an "input signal present" state to a "no input signal" state. Also, an output buffer is provided, at the output stage of the digital-to-analog converting section, to shift the converted analog signal in response to an offset-adjusting current. Thus, the offset adjustment can be effected without adversely influencing the oscillation-preventing action of D.C. dithers.

6 Claims, 2 Drawing Sheets

DIGITAL-TO-ANALOG CONVERTER

BACKGROUND OF THE INVENTION

The present invention relates generally to digital-to-analog converter circuitry (or device) employing a delta-sigma (ΔΣ) modulator, and more particularly to an improved digital-to-analog converter circuit having a function to calibrate its output offset voltage (i.e., offset adjustment function).

In recent years, there have been employed, in the technical field of digital audio, one-bit digital-to-analog converters (hereinafter, sometimes called DACs) which use a delta-sigma (ΔΣ) modulator to re-quantize multi-bit digital data into one-bit digital data. Generally, delta-sigma modulators are implemented by modifying the design of a conventional delta (Δ) modulator having an input stage provided with an integrator to boost low-frequency components and an output stage provided with a differentiator for cutting-off low-frequency components, and they are known as having the noise-shaping effect that pushes quantization noise toward the high-frequency regions to thereby enhance the S/N ratio in the audio frequency range.

These one-bit DACs with the delta-sigma modulator, however, have the problem that during a silent period, such as a period between difference music pieces, when "zero-value" input data occur in succession after a successive train of digital input data, some of the data left in the integrator would present unstable outputs and even lead to undesirable oscillation, resulting in unwanted noise in the audio frequency range. One typical example of the conventional approaches to avoid such undesirable oscillation in the audio frequency range is to apply oscillation-preventing direct current (D.C.) values to the input stage of the DAC as so-called "D.C. dither". The use of such D.C. dither can convert, into random (white) noise, the residual noise that would occur during successive input of "zero-value" signals.

Also, as an approach to automatically adjust D.C. offset in the DACs, it has been known to cancel the offset value by comparing each DAC's output with a reference potential level during a predetermined calibration period when zero-value input data occur in succession. During normal operation, the offset value determined during the calibration period is retained in a register or the like and fixedly applied to the addition input of the DAC, as disclosed in, for example, Japanese Patent Laid-open Publication No. HEI-4-245717.

However, significant inconveniences would arise where the approach of applying the oscillation-preventing D.C. dither is combined with the approach of automatically adjusting D.C. offset. Namely, because the D.C. dither operate equivalently to the random offset applied to the input stage of the DAC, applying the offset values to the input stage for addition or subtraction as mentioned above would cancel the effect of the D.C. dither in the DAC.

SUMMARY OF THE INVENTION

It is therefore an object of the present invention to provide an improved digital-to-analog converter which can adjust D.C. offset without impairing the effect of D.C. dither.

In order to accomplish the above-mentioned object, the present invention provides a digital-to-analog converter circuit including a delta-sigma modulator, an adder provided at the signal input stage of the converter circuit to add an oscillation-preventing D.C. value to an input signal, and an output buffer provided at the signal output stage of the converter circuit, and the digital-to-analog converter circuit is characterized by further comprising: a comparator which compares an output from the output buffer with a reference potential level to yield a high-level output signal or low-level output signal; an up/down counter to which clock pulses are supplied during a predetermined calibration period when no input data is present and which counts up or counts down the clock pulses in response to the high-level output signal or low-level output signal from the comparator; a current source circuit including a plurality of switches and a plurality of current supply sources which selectively supply the output buffer with an offset-adjusting current via the switches; and an inversion detector which detects an inversion in the output signal from the comparator to thereby latch output data from the up/down counter.

In a preferred implementation, the current source circuit includes an NMOS current mirror circuit having a plurality of pre-weighted current source NMOS transistors, and a PMOS current mirror circuit having a plurality of pre-weighted current source PMOS transistors.

In the digital-to-analog converter (DAC) circuit of the present invention, a plurality of the current supply sources are connected with the output of the output buffer and any one of the current supply sources is selected to effect the offset adjustment at the stage of the output buffer, rather than the offset value being added or subtracted at the signal input stage. Thus, pure offset components of the converter circuit can be eliminated without adversely influencing the oscillation-preventing action of D.C. dither. Because the D.C. dither is intended solely to convert residual noise in the DAC to wider frequency-band noise, the effect occurs only within the DAC, and fundamentally, no D.C. offset is generated in the output buffer. However, any offset components resulting from D.C. dither can be properly adjusted without impairing the effect of the D.C. dither.

According to another aspect, the present invention provides a digital-to-analog converter device, which comprises: a digital-to-analog converting section including a delta-sigma modulator, the digital-to-analog converting section converting an input digital signal to an analog signal on the basis of delta-sigma modulation of the input digital signal by the delta-sigma modulator; a digital adder provided at an input stage of the digital-to-analog converting section, to add an oscillation-preventing direct current value to the input digital signal; an output buffer provided at an output stage of the digital-to-analog converting section, to shift the converted analog signal from the digital-to-analog converting section in response to an offset-adjusting signal; and an offset-adjusting circuit which supplies the output buffer with the offset-adjusting signal.

By thus applying offset adjustment to a D/A converted analog signal at the output stage of the digital-to-analog converting section, the offset adjustment can be effected properly without adversely influencing the oscillation-preventing action of D.C. dither. Detailed arrangement of the offset adjusting circuit should not be construed as limited to that of the preferred embodiment which will be described below and may be any other suitable ones as long as they can perform offset adjustment of an analog signal received by the output buffer.

BRIEF DESCRIPTION OF THE DRAWINGS

For better understanding of the above and other features of the present invention, the preferred embodiments of the invention will be described in greater detail below with reference to the accompanying drawings, in which.

DETAILED DESCRIPTION OF THE PREFERRED EMBODIMENTS

Figure 1:
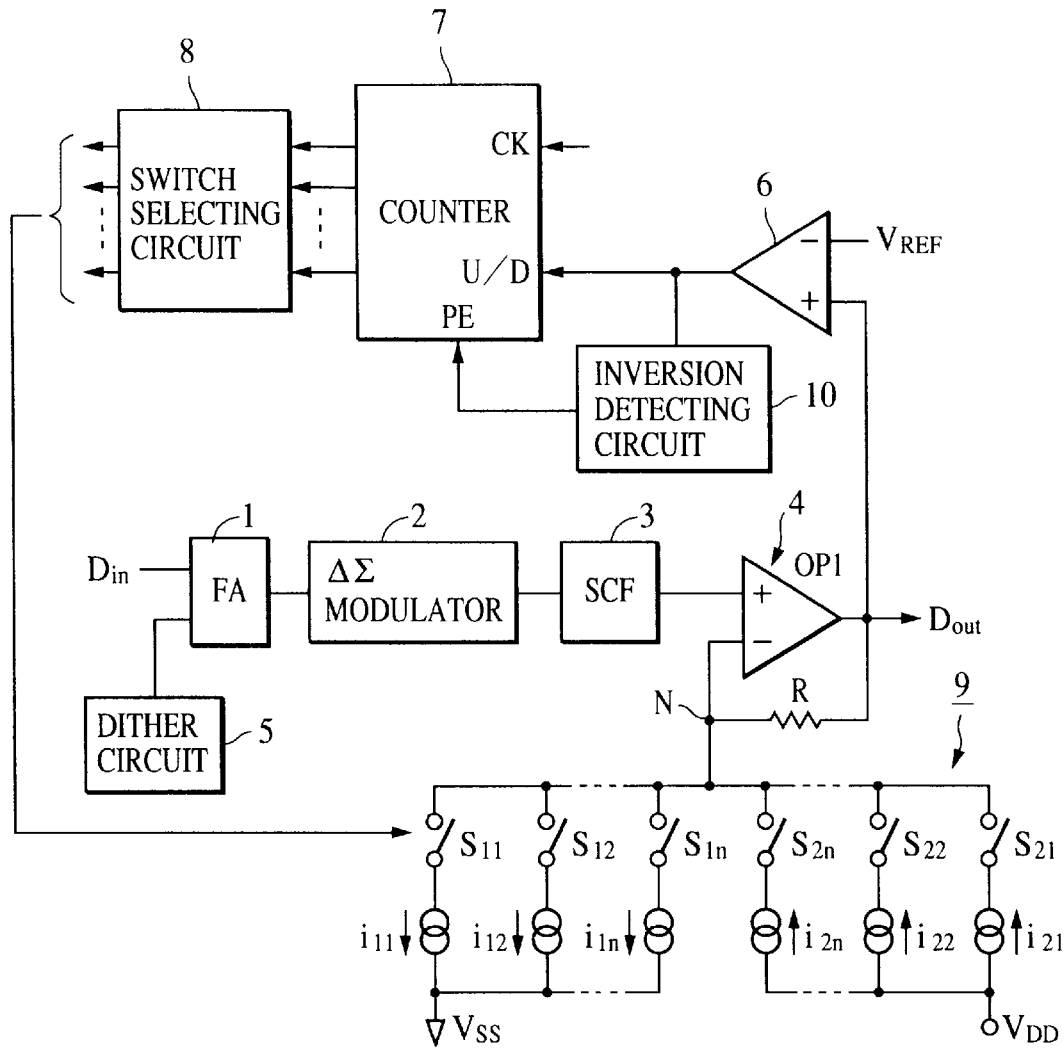
FIG. 1 is a block diagram illustrating an exemplary overall structure of a one-bit DAC in accordance with an embodiment of the present invention.

FIG. 1 is a block diagram illustrating a one-bit DAC in accordance with a preferred embodiment of the present invention. The one-bit DAC generally of the invention comprises: a full-adder 1 for adding together multi-bit digital input data $D_{in}$ and a D.C. dither signal from a D.C. dither circuit 5; a delta-sigma ($\Delta\Sigma$) modulator 2 for converting the added data from the full-adder 1 into a one-bit analog signal; a switched capacitor filter (SCF) 3 that constitutes a low-pass filter for removing high-frequency components from the analog output from the delta-sigma modulator 2; and an output buffer 4 coupled with an output terminal of the switched capacitor filter 3.

Figure 2:
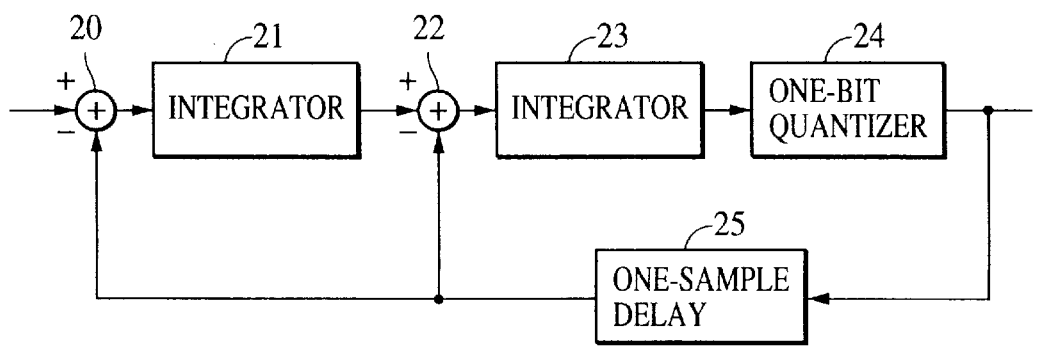
FIG. 2 is a block diagram illustrating an exemplary detailed setup of a delta-sigma modulator in the embodiment of FIG. 1.

The above-mentioned delta-sigma modulator 2 is, for example, a second-order delta-sigma modulator which includes two adders 20 and 22, two integrators 21 and 23, a one-bit quantizer 24, and a one-sample delay circuit 25, as shown in FIG. 2.

The output buffer 4 of FIG. 1 is a voltage follower, where a feedback resistor R is connected between its output terminal and inverted input terminal N and its non-inverted input terminal functions as a signal input terminal. To adjust D.C. offset via the output buffer 4, in the present embodiment, the inverted input terminal N is coupled to a current source circuit 9 that switchably couples one of a plurality of current supply sources with the terminal N. Specifically, this current source circuit 9 includes a plurality of pull-in current supply sources $i_{11}$ to $i_{1n}$ that are connected via a plurality of corresponding switches $S_{11}$ to $S_{1n}$ between the inverted input terminal N and a negative power supply $V_{ss}$, and a plurality of service current sources $i_{21}$ to $i_{2n}$ that are connected via a plurality of corresponding switches $S_{21}$ to $S_{2n}$ between the inverted input terminal N and a positive power supply $V_{DD}$, where "n" is an arbitrary number.

Further, to selectively activate one of the switches depending on an output D.C. offset during a predetermined calibration period, the DAC includes: a comparator 6 that compares an output potential level of the output buffer 4 with a reference potential level (=zero level); an up/down counter 7 that receives clock pulses from an external clock in response to calibration instructions and counts up or counts down the clock pulses in response to a high (H)- or low (L) level output signal from the comparator 6; and a switch selecting circuit 8 that decodes the output from the counter 7 to select one of the switches of the current source circuit 9. The output terminal of the comparator 6 is connected with an inversion detecting circuit 10 that detects an inversion in the output signal of the comparator 6 so as to generate an adjustment-completion signal. This adjustment-completion signal from the inversion detecting circuit 10 is passed to a preset-enable (PE) terminal of the counter 7 so as to latch the output data of the counter 7 occurring at the time of the inversion detection.

Figure 3:
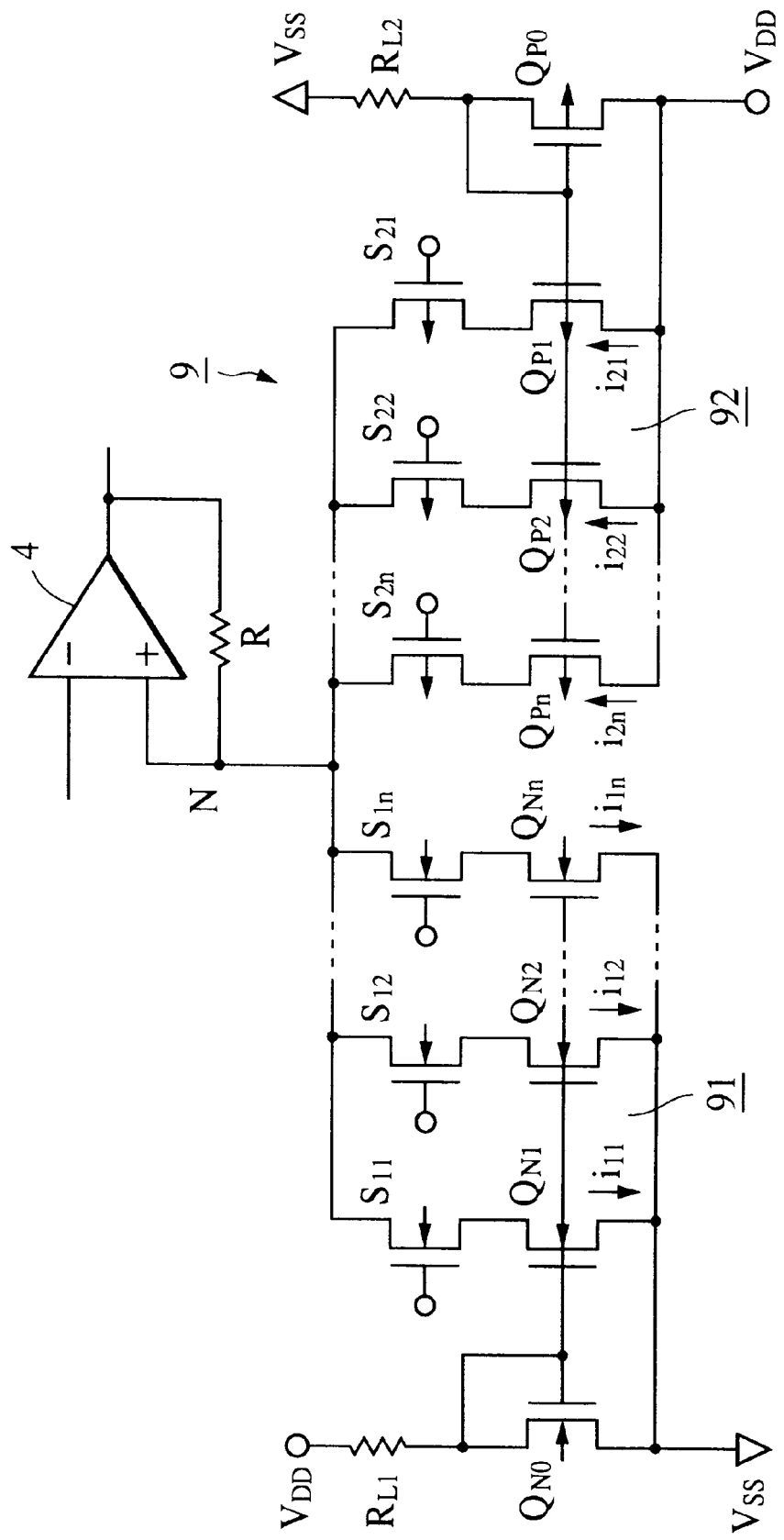
FIG. 3 is a block diagram illustrating an exemplary detailed setup of a current source circuit in the embodiment of FIG. 1.

As shown in greater detail in FIG. 3, the current source circuit 9 comprises a pair of NMOS and PMOS current mirror circuitry. The NMOS current mirror circuit 91 includes a reference-current supply source composed of an NMOS transistor $Q_{N0}$ having its gate and drain connected with each other and a load resistor $R_{L1}$, and a plurality of NMOS transistors $Q_{N1}$ to $Q_{Nn}$ having respective gates connected with the gate of the NMOS transistor $Q_{N0}$ to provide constant-current supply sources $i_{11}$ to $i_{1n}$. Similarly, the PMOS current mirror circuit 92 includes a reference-current power supply composed of a PMOS transistor $Q_{P0}$ having its gate and drain connected with each other and a load resistor $R_{L2}$, and a plurality of PMOS transistors $Q_{P1}$ to $Q_{Pn}$ having respective gates connected with the gate of the PMOS transistor $Q_{P0}$ to provide constant-current supply sources $i_{21}$ to $i_{2n}$. The switches $S_{11}$ to $S_{1n}$ in the NMOS current mirror circuit 91 are each implemented by an NMOS transistor, while the switches $S_{21}$ to $S_{2n}$ in the PMOS current mirror circuit 92 are each implemented by a PMOS transistor.

The individual constant-current supply sources in the current source circuit 9 are pre-weighted in a linear manner, such as $i_{11}=i_{21}=i_0$, $i_{12}=i_{22}=2 \cdot i_0$, . . . , $i_{1n}=i_{2n}=n \cdot i_0$.

In the current source circuit of FIG. 3, the current values, for the NMOS transistors $Q_{N1}$ to $Q_{Nn}$ and the PMOS transistors $Q_{P1}$ to $Q_{Pn}$, are pre-weighted with their respective ratios of channel width W to channel length L (W/L).

To the DAC arranged in the above-mentioned manner, D.C. dither that randomly varies in level in a predetermined cycle is constantly applied from the dither circuit 5 in such a manner that undesirable oscillation in the audio frequency range is not caused, during a "no input signal period" when digital input data $D_{in}$ =0, by the data left in the two integrators 21 and 23 constituting the delta-sigma modulator 2. Also, the offset adjustment in the DAC is effected, during an optional calibration period when no digital input data $D_{in}$ is received, by applying clock pulses to the up/down counter 7 in response to an external instruction. The comparator 6 compares an output voltage level with the reference potential level (namely, zero level) so that if the offset voltage is positive, it generates a "High"-level signal to instruct the counter 7 to count down the clock pulses. In response to the counter 7 counting down by one, the switch selecting circuit 8 turns on the switch $S_{21}$ of the minimal constant-current supply source $i_{21}$ connected to the positive power supply $V_{DD}$ of the circuit 9.

Thus, a current value of $i_{21}=i_0$ is supplied to the inverted input terminal N and then flows through feedback resistor R. Because the inverted input terminal N functions as a virtual ground, the output potential of the output buffer 4 is lowered by $R \cdot i_0$. In the event that the output of the comparator 6 is not inverted in response to this lowered output potential, the counter 7 further counts down by one, in response to which the switch selecting circuit 8 turns on the switch $S_{22}$ of the next constant-current supply source $i_{22}$ connected to the positive power supply $V_{DD}$ of the circuit 9. Thus, the output potential of the output buffer 4 is lowered by $2R \cdot i_0$. Similar operations are repeated until the output of the comparator 6 is inverted.

Then, once the output potential of the output buffer 4 reaches the reference potential $V_{REF}$ (namely "0") or below, the output of the comparator 6 is inverted, which represents a completion of the offset adjustment. Then, the inversion detecting circuit 10 issues an "offset-adjustment completion" signal, which is then given to the preset-enable (PE) terminal of the counter 7 so as to latch the output data occurring at that time. After that, the current source circuit 9 will be maintained in a condition where the optimum constant-current supply source is selected for the offset adjustment.

Practically similar operations take place when the D.C. offset voltage is of negative polarity. In this case, the counter 7 operates to count up in such a manner that the switch selecting circuit 8 successively turns on the $S_{11}$ to $S_{1n}$, in order of ascending current value, connected to the negative power supply $V_{ss}$ of the current source circuit 9.

Where the individual current values in the current source circuit 9 are pre-weighted linearly using "$i_0$" as the minimal current value as previously noted, offset voltage can be eliminated up to a range of $\pm R \cdot i_0$.

In the preferred embodiment of the present invention, the offset adjustment is effected only at the stage of the output buffer without involving feedback to the input stage, so that the output offset voltage can be eliminated without impairing the effect of D.C. dither in the DAC. If the current source circuit is constructed of current mirror circuits as shown in FIG. 3, an increase in the area of an LSI (Large Scale Integrated circuit) used will not present any problems.

The present invention should not be construed as limited to the preferred embodiment alone, and various modifications are possible without departing from the basic feature of the present invention. For example, whereas the embodiment has been described as pre-weighing the individual current supply sources and switching use of the supply sources one by one, the current supply sources may be set to a same current value so that one of the current supply sources is sequentially added in response to the count-up or count-down by the counter 7.

In summary, the present invention arranged in the above-described manner is characterized by the provision of the current source circuit having a plurality of current supply sources and connected with the output terminal of the output buffer. With this characteristic arrangement, the present invention can provide a digital-to-analog converter (DAC) circuit converter which can properly adjust D.C. offset at the stage of the output buffer without impairing the effect of D.C. dither.

What is claimed is:

1. A digital-to-analog converter circuit including a delta-sigma modulator, an adder provided at an signal input stage to add an oscillation-preventing D.C. value to an input signal, and an output buffer provided at a signal output stage, said digital-to-analog converter circuit further comprising:

a comparator which compares an output from said output buffer with a reference potential level to yield a high-level output signal or low-level output signal;

an up/down counter to which clock pulses are supplied during a predetermined calibration period when no input data is present and which counts up or counts down the clock pulses in response to the high-level output signal or low-level output signal from said comparator;

a current source circuit including a plurality of switches and a plurality of current supply sources which selectively supply said output buffer with an offset-adjusting current via said switches; and an inversion detector which detects an inversion in the output signal from said comparator to thereby latch output data from said up/down counter.

2. A digital-to-analog converter circuit as recited in claim 1 wherein said current source circuit includes an NMOS current mirror circuit having a plurality of pre-weighted current source NMOS transistors, and a PMOS current mirror circuit having a plurality of pre-weighted current source PMOS transistors.

3. A digital-to-analog converter device comprising:

a digital-to-analog converting section including a delta-sigma modulator, said digital-to-analog converting section converting an input digital signal to an analog signal on the basis of delta-sigma modulation of the input digital signal by said delta-sigma modulator;

a digital adder provided at an input stage of said digital-to-analog converting section, to add an oscillation-preventing direct current value to the input digital signal;

an output buffer provided at an output stage of said digital-to-analog converting section, to shift the converted analog signal from said digital-to-analog converting section in response to an offset-adjusting signal; and an offset-adjusting circuit which supplies said output buffer with the offset-adjusting signal.

4. A digital-to-analog converter device as recited in claim 3 wherein said offset-adjusting circuit includes:

a first circuit which, during a predetermined calibration period when no input digital signal is present, determining an offset-adjusting value on the basis of a comparison between an output from said output buffer and a predetermined reference voltage level; and a second circuit which supplies said output buffer with an offset-adjusting current corresponding to the offset-adjusting value determined by said first circuit as said offset-adjusting signal.

5. A digital-to-analog converter device as recited in claim 4 wherein said first circuit includes a comparator that performs the comparison between an output from said output buffer and a predetermined reference voltage level, a circuit that successively increments or decrements the offset-adjusting value in response to an output from said comparator, and a circuit that detects completion of offset adjustment from an inversion in an output from said comparator so as to latch the offset-adjusting value occurring when the completion of offset adjustment has been detected, and wherein said second circuit includes a variable current supply source circuit that switches a value of the offset adjusting current in response to the offset-adjusting value supplied by said first circuit, the value of the offset adjusting current varies in accordance with an incrementing or decrementing variation of the offset-adjusting value, and when the offset-adjusting value is latched, the value of the offset adjusting current is maintained at a value corresponding to the latched offset-adjusting value.

6. A digital-to-analog converter device as recited in claim 5 wherein said offset-adjusting value takes a value of positive or negative sign, and said variable current supply source circuit includes positive and negative power supplies in such a manner that said variable current supply source circuit supplies the offset-adjusting current of positive or negative polarity depending on the offset-adjusting value and positive or negative sign thereof.

* * * * *